(12) United States Patent
Maier et al.

(10) Patent No.: US 9,981,843 B2
(45) Date of Patent: May 29, 2018

(54) CHIP PACKAGE AND A METHOD OF PRODUCING THE SAME

(71) Applicant: Infineon Technologies AG, Neubiberg (DE)

(72) Inventors: Dominic Maier, Pleystein (DE); Alfons Dehe, Reutlingen (DE); Thomas Kilger, Regenstauf (DE); Markus Menath, Regensburg (DE); Franz Xaver Muehlbauer, Rimbach (DE); Daniel Porwol, Straubing (DE); Juergen Wagner, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/138,313

(22) Filed: Apr. 26, 2016

(65) Prior Publication Data

US 2016/0311679 A1    Oct. 27, 2016

(30) Foreign Application Priority Data

Apr. 27, 2015  (DE) .................. 10 2015 106 442

(51) Int. Cl.
*H01L 29/84* (2006.01)
*B81C 1/00* (2006.01)

(52) U.S. Cl.
CPC ...... *B81C 1/00896* (2013.01); *B81C 1/00269* (2013.01); *B81C 1/00801* (2013.01); *B81C 2201/0194* (2013.01); *B81C 2201/053* (2013.01)

(58) Field of Classification Search
CPC ..................... B81C 1/00896; B81B 7/0058
See application file for complete search history.

(56) References Cited

FOREIGN PATENT DOCUMENTS

| DE | 102013108353 A1 | 2/2014 |
|---|---|---|
| DE | 102013106353 A1 | 12/2014 |
| WO | 2014202283 A2 | 12/2014 |

*Primary Examiner* — Marc Armand
*Assistant Examiner* — Sarah Salerno
(74) *Attorney, Agent, or Firm* — Murphy, Bilak & Homiller, PLLC

(57) ABSTRACT

A method of producing a chip package is described. A plurality of chips is provided on a first wafer. Each chip has a cavity which opens to a first main face of the chip. The cavities are filled or covered temporarily. The chips are then singulated. The singulated chips are embedded in an encapsulation material, and then the cavities are re-exposed.

20 Claims, 8 Drawing Sheets

CHIP PACKAGE AND A METHOD OF PRODUCING THE SAME

TECHNICAL FIELD

The present invention relates generally to a method of producing a chip package and to a chip package. The present invention relates more specifically to a chip package comprising a chip which has a cavity. The cavity is open to a first main face of the chip.

BACKGROUND

During packaging the cavity may be filled unintentionally by an encapsulation material. Furthermore, a structure delimitating the cavity may be damaged. This may be especially a problem if the cavity is delimited by a mechanically fragile structure.

For this and other reasons there is a need for the present invention.

BRIEF DESCRIPTION OF THE DRAWINGS

The accompanying drawings are included to provide a further understanding of embodiments and are incorporated in and constitute a part of this description. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION

Figure 1:
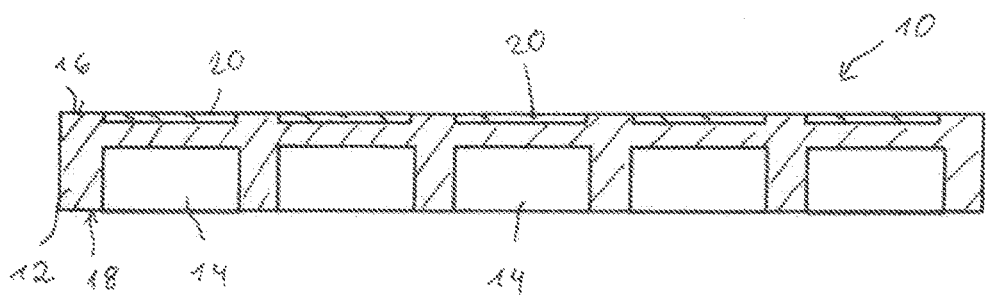
FIG. 1 illustrates a cross-sectional view of a first wafer in accordance with the disclosure.

In the following embodiments are described with reference to the drawings wherein like reference numerals are generally utilized to refer to like elements throughout. In the following description, for purposes of explanation, numerous specific details are set forth in order to provide a thorough understanding of one or more aspects of embodiments. However, it may be evident to a person skilled in the art that one or more aspects of the embodiments may be practiced with a lesser degree of these specific details. The following description is therefore not to be taken in a limiting sense, and the scope of protection is defined by the appended claims.

The various aspects summarized may be embodied in various forms. The following description shows by way of illustration various combinations and configurations in which the aspects may be practiced. It is understood that the described aspects and/or embodiments are merely examples and that other aspects and/or embodiments may be utilized and structural and functional modifications may be made without departing from the scope of the present disclosure. In addition, while a particular feature or aspect of an embodiment may be disclosed with respect to only one of several implementations, such feature or aspect may be combined with one or more other features or aspects of the other implementations as it may be desired and advantageous for any given or particular application. Further, to the extent that the terms "include", "have", "with" or other variants thereof are used in either the detailed description or the claims, such terms are intended to be inclusive in a manner similar to the term "comprise". Also, the term "exemplary" is merely meant as an example, rather than the best or optimal.

Chip packages and methods for manufacturing the same are described herein. Comments made in connection with the described packaged chip may also hold true for corresponding method and vice versa. For example, if a specific component of a packaged chip or chip package is described, a corresponding method for manufacturing or producing the packaged chip or chip package may include an act of providing the component in a suitable manner, even if such an act is not explicitly described or illustrated in the figures. In addition, the features of the various exemplary aspects described herein may be combined with each other, unless specifically noted otherwise.

Methods described herein may comprise providing a plurality of chips on a first wafer. The first wafer may be a semiconductor wafer. The semiconductor wafer may be e.g. a silicon wafer (Si), a gallium-arsenide wafer (GaAs), an organic semiconductor wafer or another wafer comprising other III-V or II-IV materials or any other compound material. The first wafer may be a layered wafer comprising layers of different materials.

The chips may comprise a cavity each, the cavity opening into a first main face of the chip. The cavity may be of any form and any depth. The cavity may be delimited at a second main face of the chip which is opposite the first main face. The cavity may be provided in the chip to form a structure thinner than the chip. E.g. the cavity may be delimited at the second main face of the chip by a mechanically fragile structure or the cavity may be intended to be delimited by a mechanically fragile structure. Whether a structure is mechanically fragile may depend on a material of the structure, dimensions of the structure and/or a form of the structure. Whether a structure is to be considered as mechanically fragile may depend on processing steps performed on a chip comprising the mechanically fragile structure.

In the present application a mechanically fragile structure may be a structure which is easily damaged during processing in a way that a process yield may be decreased due to damaged mechanically fragile structures.

The mechanically fragile structure may be a thin layer. A thin layer may be a layer with a thickness of e.g. under 5 micrometer (μm). A thin layer may be a layer with a thickness of e.g. under 1 micrometer (μm). A thin layer may be a layer with a thickness of e.g. under 500 nanometer (nm). The thin layer may comprise a semiconductor device as e.g. a vertical transistor, a horizontal transistor or any other semiconductor device.

The chips may be micro-electro-mechanical chips, also known as MEMS (micro-electro-mechanical systems) chips. Micro-electro-mechanical chips allow for very small electronic devices. An example of micro-electro-mechanical chips are MEMS microphones. In an MEMS microphone, the mechanically fragile structure may be a membrane. MEMS microphones are used e.g. in cell-phones, laptops and tablets. Other micro-electro-mechanical systems may comprise sensors and actors, for examples gyroscopic sensors.

Further, the chip may comprise a micro-optical-mechanical system, or in other words, the mechanically fragile structure may be a micro-optical-mechanical structure or a micro-optical-electrical-mechanical structure. E.g., a mechanical deflection of the fragile structure may be detected optically. The chip may be an MOEMS chip which stands for an optical MEMS chip.

Mechanically fragile structures may have dimensions from under 1 micrometer (μm) to several micrometers and are very easily damaged. During processing the mechanically fragile structures may be embedded in a sacrificial layer which is only destroyed at a very late moment during processing. However, even embedded in a sacrificial layer, the mechanically fragile structure remains sensitive and special care may have to be taken during packaging of the chip.

The chips to be packaged may comprise or be part of a sensor, a transducer or an actuator as, for example, pressure sensors, acceleration sensors, rotation sensors, elongation sensors, microphones etc. The chips may comprise an electro-mechanical element which may be e.g. a bridge, a membrane, or a tongue structure. The chips may comprise an optical-mechanical element.

A microphone MEMS chip may comprise a membrane. The membrane may be a flexible membrane. The microphone MEMS chip may further comprise a fixed or rigid plate which may be called a back plate. The back plate or back electrode and the membrane may form together a detection capacitor with variable capacitance. They may form a transducer transforming acoustic waves into electric voltage variations. Further MEMS chips may be configured as angular position sensors, motion sensors, Hall sensors or GMR sensors (GMR: giant magneto resistance). The membrane may be made e.g. of silicon or metal. A thickness of the membrane may be less than 1000 nm, 500 nm, 300 nm or thinner. The membrane may be distant from the back plate about 1 μm to about 3 μm. In other embodiments the gap distance may be less than about 1 μm or greater than about 3 μm.

The chips comprised on the first wafer may comprise a cavity each. The cavity may be adjacent to the mechanically fragile element or structure. The cavity may be etched into the chip. In other words, the first wafer may comprise a plurality of cavities. The cavities may be of circular shape. The cavities may have any other shape. Side walls of the cavities may be essentially perpendicular to a main surface of the first wafer. Side walls of the cavities may be generally tapered. For micro-electro-mechanical chips for use in a microphone or more specifically in a silicon microphone the cavities may define a so-called back volume of the microphone and extend from the membrane to the opposite surface of the first wafer or more specifically of the first silicon wafer.

The plurality of cavities may be formed by a lithographic step. A lithographic step may comprise applying a photoresist in form of a mask onto the first wafer. In an etch process the exposed semiconductor surface can be etched to form the cavities without damaging the parts protected by the mask. Lithographic steps on wafer level are well-known in the art and a high accuracy of positioning is achieved.

In a following packaging step, however, the cavities may be damaged or accidently filled with undesired materials. Filling the cavities with e.g. encapsulation material may hinder later access to the cavities for e.g. filling them with another material or for contacting a bottom of the cavities. Filling the cavities with e.g. encapsulation material may damage an underlying electro-mechanical structure or more generally the mechanically fragile structure. The method of producing a chip package may therefore further comprise filling or covering the cavities temporarily. Temporarily filled or covered cavities may not be filled accidently with undesired material. In an embodiment a mechanically fragile structure may be further protected by covering the mechanically fragile structure from a side opposite the cavity temporarily, e.g. by a cover which is formed to have a recess over the mechanically fragile structure. By filling or covering the cavities temporarily they may be protected. In an embodiment the cavities may be temporarily covered by a second wafer. The second wafer may be a semiconductor wafer. The second wafer may also be of another rigid material. The cover may also be, for example, a sufficiently thick adhesive foil. The second wafer or more generally the cover may be bonded to the first wafer to a main side of the first wafer to which the cavities open. Bonding may be effectuated by an adhesive. Any suitable adhesive may be used. A suitable adhesive is adapted to the temperatures and pressures encountered during further processing steps. The adhesive may be a so-called permanent adhesive. A permanent adhesive is not provided with any special characteristic allowing a controlled destruction of its adhesive force. The permanent adhesive may also have a high adhesive force which does not allow an easy mechanical debonding. It is to be understood that, although the cavities are only temporarily covered by the cover, the cover can be securely adhered to the first wafer without provision of a debonding mechanism. Bonding may be effectuated e.g. by an adhesive foil or by applying an adhesive onto the cover and/or onto the first wafer and curing the adhesive for bonding.

In an embodiment, bonding of the cover to the first wafer may be effectuated under a specific pressure. Bonding under a specific pressure may comprise bonding under vacuum i.e. the cavities are vacuum-sealed. Bonding may also occur under a specific pressure which is lower than the atmospheric pressure but higher than vacuum to provide an intermediate pressure which may be intermediate to the maximum and minimum pressures encountered during further processing. In a further embodiment, the cavities may be filled with a suitable liquid prior to bonding the cover to the first wafer. This also allows having little pressure effects during processing steps although the cavities are hermetically closed or sealed.

In further embodiments, the cavities may be filled with a filling material. The filling material may be solid rather than liquid. In embodiments the filling material may comprise silicone. In embodiments with a solid filling material no cover is needed. The cavities are not covered but filled with the solid filling material to protect them.

Covering or filling the cavities further provides stability to the first wafer. In embodiments, the chips comprised on the first wafer are singulated after filling the cavities temporarily. As the cover or the filling material stabilizes the side walls of the cavities any separation process for singulating may be used. Especially it is possible to singulate the micro-electro-mechanical chips by sawing. Of course other singulating methods as e.g. stealth dicing or etching are possible.

In embodiments, packaging of the micro-electro-mechanical chips is effectuated by producing a so-called reconstituted wafer. The singulated chips or dies may be picked up and placed onto a temporary carrier. Pick-and-place of the semiconductor dies or chips may be effectuated by known pick-and-place tools. The dies may be placed on the temporary carrier with a distance separating adjacent chips which is greater than the distance the chips had on the first wafer. It is possible to place also other chips from other semiconductor wafers on the temporary carrier in order to form system in packages. In the example of a microphone, a micro-electro-mechanical chip comprising a membrane may be associated with a semiconductor chip comprising logical circuitry or power circuitry. For example, the further component or further semiconductor chip may comprise a pre-amplifier and input/output terminals. Alternatively, the component may comprise a protective device or a power semiconductor device integrated in the pre-amplifier.

After placing the chips onto the temporary carrier the chips may be encapsulated with an encapsulation material. The encapsulation material may comprise a polyimide, an epoxy resin, a thermo-plastic, a ceramic, a metal ceramic, or a metal plastic. The encapsulation material may comprise a laminate (prepreg), e.g., composite fibres, glass fibres, carbon fibres in an epoxy resin. The encapsulation material may be an epoxy comprising thermal conductive filler material. For example, the filler content may be at least about 70% to about 93% of silicon-oxide, aluminum oxide, boron nitride or zinc oxide. The encapsulation material may also comprise silicon heavily filled with filler material. The encapsulation material may cover the dies and fill spaces between the dies.

The encapsulation material may cover the cover and/or the filling material in the cavities. Subsequent processing may comprise forming a redistribution layer. A redistribution layer may comprise insulating layers and electrically conducting layers. The electrically conducting layers may be structured. The insulating layers may comprise through-contacts or vias.

Embodiments may comprise re-exposing the cavities after embedding the singulated chips in the encapsulation material. Re-exposing the cavities may comprise a grinding step. Grinding may comprise grinding the encapsulation material covering the cover which covers the cavities. Re-exposing the cavities may comprise grinding the encapsulation material and part of the filling material. In embodiments, where the cavities are filled with solid filling materials, exposing the cavities may comprise taking off the filling material. The filling material may be selectively removable from the cavities. In an embodiment the filling material may be selectively etchable. Selectively etchable may indicate that an etchant etches the filling material with a high rate while the surrounding material of the first wafer, e.g. silicon, is etched with a very low rate. The filling material may also be selectively removable because it is water-soluble. The filling material may also be selectively removable because it has a coefficient of thermal expansion which is different from the coefficient of thermal expansion of the first semiconductor wafer material. Thus, submitting the reconstituted wafer to a low or a high temperature, the filling material may contract more than the surrounding material and thus easily be taken out of the cavities.

In embodiments, the re-exposed cavities may be further etched. No masking may be necessary for etching further the cavities because the side walls of the cavities and the surrounding encapsulation material forms a kind of hard mask. It may be an advantage not to need a further masking step, as the singulated chips may be situated in the encapsulant material with a smaller precision to each other than in the wafer and therefore lithographic steps may be less accurate. Etching the cavity may comprise an anisotropic etch etching the bottom of the cavity and an upper surface of the cavity side walls.

In embodiments, the mechanically fragile structure, e.g. the micro-electro-mechanical structure may be protected by one or more sacrificial layers. The sacrificial layers may be removed as late as possible by an etching step. Removing the sacrificial layer(s) may require access to the micro-electro-mechanical structure from an upper side of the chip and from a lower side of the chip, i.e. from the side of the cavity.

After finalizing the mechanically fragile structure, e.g. the micro-electro-mechanical structure, i.e. after removing the sacrificial layer, the cavities may be covered by a lid. The lid may cover all cavities on the reconstituted wafer. The lid may be arranged on the encapsulation material and may adhere to the encapsulation material. The lid may be secured to the encapsulation material using a permanent adhesive. The lid may seal the cavities. The lid may comprise a photoresist, a laminate or solid structure such as a metal or plastic. The lid may be disposed on the reconstituted wafer.

FIG. 1 schematically illustrates a cross-sectional view of a first wafer 10 according to an embodiment. The first wafer 10 may be a semiconductor wafer, especially a silicon wafer. The cross-sectional view shown in FIG. 1 shows five micro-electro-mechanical chips. The person skilled in the art will understand that more or less chips may be comprised in a cross-section of wafer 10 and that these chips are not necessarily micro-electro-mechanical chips. In the following but without limitation the first wafer is addressed as silicon wafer formed of silicon material 12 and the chips are addressed as MEMS (micro-electro-mechanical system) chips. In silicon material 12 cavities 14 are etched. The silicon wafer 10 comprises a first main surface 16 and a second main surface 18 opposite the first surface 16. The cavities 14 are open to the second surface 18. On the first surface 16 micro-electro-mechanical structures 20 are formed. These may be any micro-electro-mechanical structures as, for example those discussed above. In the embodiment shown in FIG. 1 the micro-electro-mechanical structure 20 comprises a transducer with a rigid back plate and a flexible membrane for forming an MEMS microphone.

Figure 2:
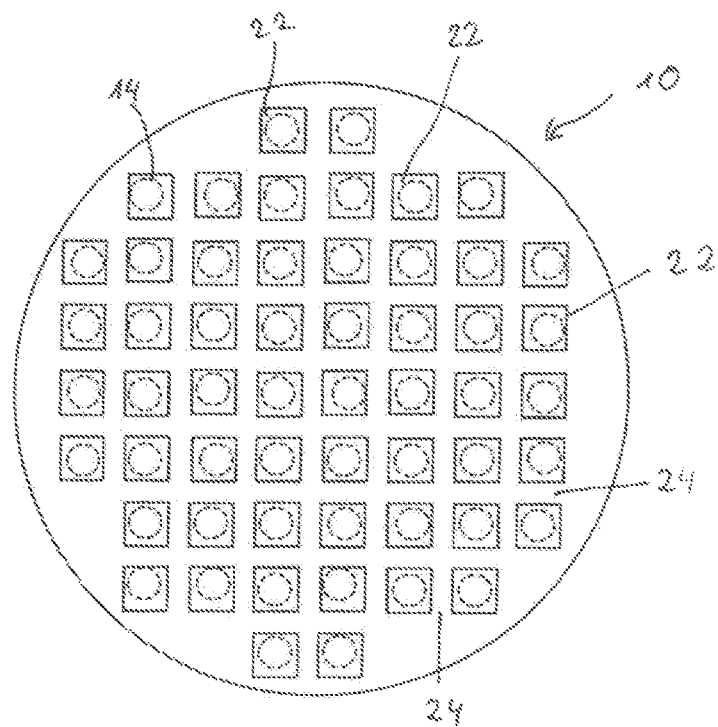
FIG. 2 schematically illustrates a top view of a first wafer in accordance with the disclosure.

FIG. 2 shows schematically a top view of silicon wafer 10. A plurality of MEMS chips is arranged on the wafer in rows and columns. The chips 22 are separated by saw lines 24. Each chip 22 is essentially rectangular and a circular cavity 14 is indicated by broken lines. Cavities 14 may be centered in chips 22. A method according to the disclosure for packaging MEMS chips 22 is now explained with reference to FIGS. 3A to 3I.

Figure 3A:
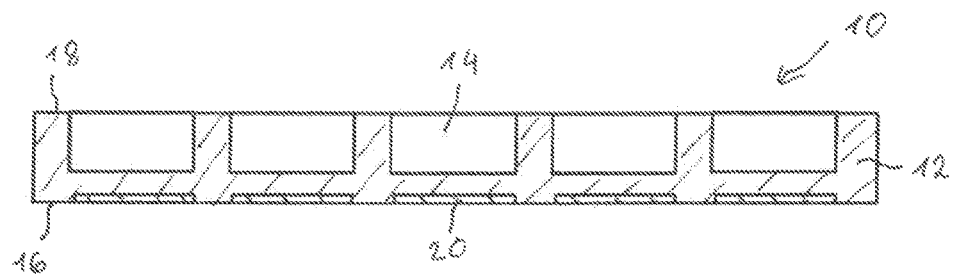
FIGS. 3A-3I schematically illustrate a method of producing a micro-electro-mechanical chip package in accordance with a first embodiment.

FIG. 3A shows the provided first wafer 10 as shown in FIG. 1. Compared to FIG. 1 wafer 10 is turned around about 180 degrees so that the first surface 16 is now represented as a lower surface and the second surface 18 is now represented as an upper surface of silicon wafer 10. As already explained with reference to FIG. 1, silicon wafer 10 comprises silicon material 12, MEMS structures 20 and cavities 14. Cavities 14 are open to the upper surface 18.

MEMS structure 20 is shown to have a surface essentially coplanar to the first surface 16 of wafer 10. It is to be understood that MEMS structure 20 may also be arranged on top of wafer surface 16 or, in other words, that MEMS structure 20 may protrude from wafer 10. More generally, MEMS structure 20 is arranged at the first surface 16. MEMS structure 20 may be protected by one or more sacrificial layers which may be, for example, oxide or nitride layers. In the embodiment shown in FIG. 3A, a layer of silicon 12 remains between cavities 14 and MEMS structures 20.

Figure 3B:
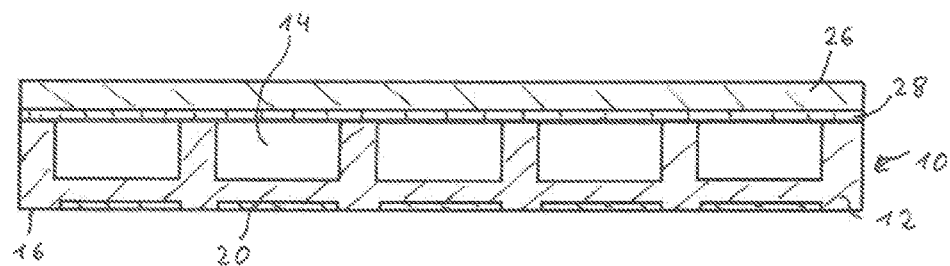

FIG. 3B shows the wafer 10 of FIG. 3A after the cavities are closed by a second wafer or cover 26. The second wafer 26 may be arranged on the second surface 18 of wafer 10. An adhesive layer 28 is arranged between wafer 10 and cover 26. Adhesive layer 28 may be an adhesive foil. Adhesive layer 28 may be formed by a permanent adhesive which may be applied in a liquid form and cured afterwards. Any permanent adhesive may be used although the cover 26 is supposed to only temporarily close cavities 14. Cavities 14 may be empty or, in other words, filled with the surrounding atmosphere or they may be filled with a gas or with a liquid. When the cavities are filled with a gas, e.g. the surrounding atmosphere, a specific pressure may be provided in the cavities. For example, the wafer 10 may be covered in a vacuum chamber with cover 26. A vacuum chamber allows for choosing a specific pressure which may be a vacuum or a specific pressure intermediate between vacuum and surrounding atmospheric pressure. It may be an advantage to have a specific pressure in that during further processing a force on the cavity walls due to a change in the outside pressure and a change in temperature may be minimized.

Figure 3C:
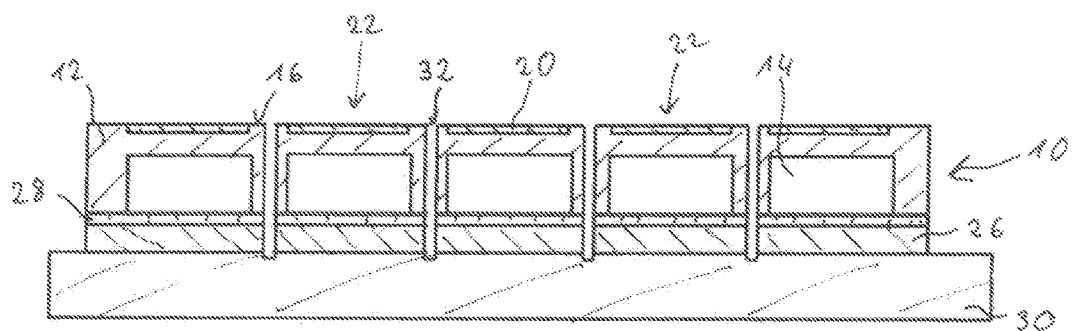

FIG. 3C shows wafer 10 which is turned round about 180 degrees with reference to FIG. 3B and placed onto a temporary carrier 30. Temporary carrier 30 may be a dicing tape. Wafer 10 with cavities 14 sealed by second wafer 26 is placed onto dicing tape 30 with the cover wafer 26 facing the temporary carrier 30. The individual chips 22 are separated by cutting lines 32 which are effectuated along the sawing lines 24 shown in FIG. 2. Cutting or dicing the chips for singulating may be effectuated by conventional wafer sawing. The second wafer or cover 26 stabilizes the chips 22 sufficiently so that dicing can be effectuated without damaging the cavities or more specifically the side walls of cavities 14.

Figure 3D:
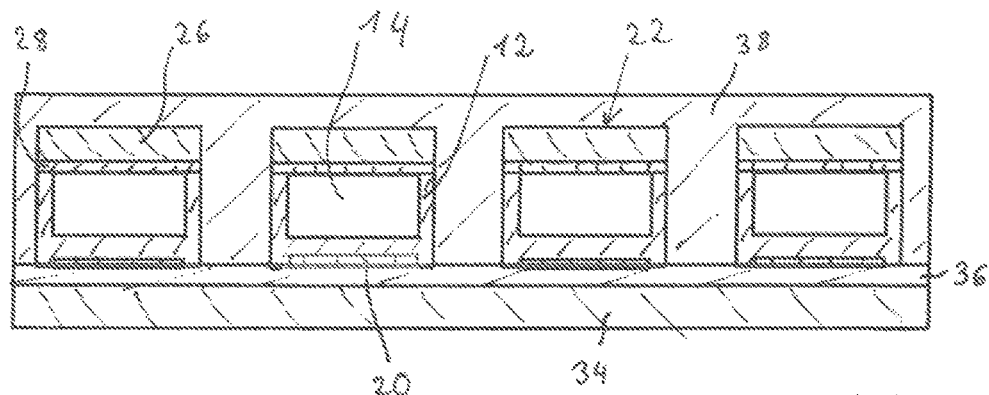

FIG. 3D shows a temporary carrier 34 which may comprise an adhesive 36 on top of carrier 34. Adhesive 36 may be a temporary adhesive or an adhesive with a low adhesive force. The singulated chips 22 may be placed on temporary carrier 34 or more exactly on the adhesive layer 36 with the MEMS structure 20 facing the adhesive layer 36. The singulated chips 22 may be placed by a pick-and-place tool as known in the art. The chips 22 may be placed on temporary carrier 34 with a distance between each other which is greater than the distance between the chips 22 on the first wafer 10. Cover 26 allows use of the pick-and-place tool without risk of damaging the cavities 14. In the embodiment shown, only chips 22 are placed on temporary carrier 34. The person skilled in the art will understand that other chips as, for example, chips comprising power amplifiers or other circuitry in use with e.g. MEMS microphones may be placed, for example alternately with chips 22 onto temporary carrier 34 for forming systems.

The chips 22 placed on carrier 34 are encapsulated by an encapsulation material 38. Encapsulation material 38 may be any suitable encapsulation material as discussed above. Encapsulation material 38 may be a mold compound. The chips 22 may be over-molded with the mold compound 38 in a mold form. Other forms of encapsulation are also possible as, for example, compression molding, injection molding, powder molding, potting, dispensing, jetting or lamination.

Figure 3E:
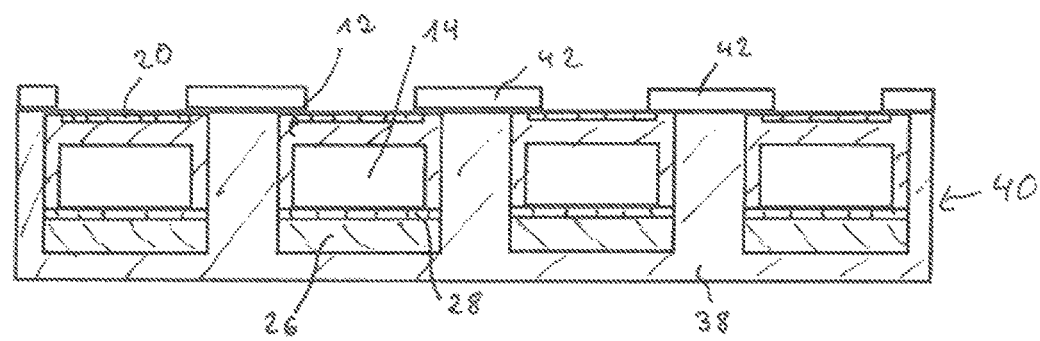

FIG. 3E shows the reconstituted wafer 40 which is formed by the encapsulated chips 22 and the encapsulation material 38. The reconstituted wafer 40 is turned round by 180 degrees with reference to FIG. 3D, and temporary carrier 34 and adhesive layer 36 are removed. A redistribution layer 42 is applied on top of the reconstituted wafer 40. Redistribution layer (RDL) 42 may comprise insulating layers and electrically conducting layers. RDL 42 may provide for interconnection between different circuit parts. Especially, RDL 42 may provide interconnections to other kinds of integrated circuits as discussed before. RDL 42 may not cover MEMS structures 20. Encapsulation material 38 provides for an easy to handle reconstituted wafer 40 and further allows fan-out structures. In other words, redistribution layer 42 is not only applied on the chips 22 but also on encapsulation material 38.

Figure 3F:
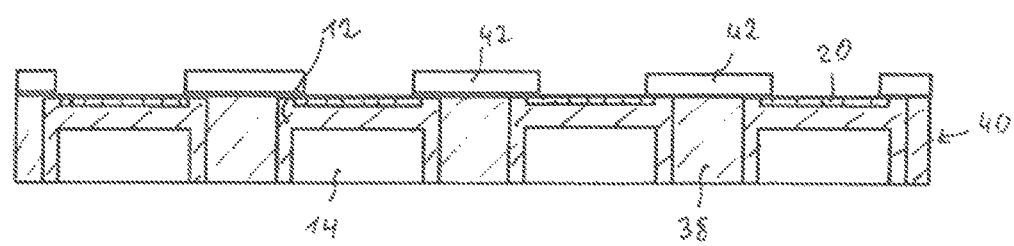

FIG. 3F shows the reconstituted wafer 40 after re-exposing cavities 14. Cavities 14 are re-exposed by taking away part of encapsulant 38, cover 26 and adhesive layer 28 by a grinding process. The grinding process removes a layer of encapsulant 38 covering covers 26 and extending between the covers 26. In FIG. 3F cavities 14 are open to a surface of the reconstituted wafer 40 opposite the RDL 42. In embodiments where cavities 14 are filled with a liquid prior to closing the cavities 14 by cover 26, the liquid is emptied. Encapsulant material 38 situated between two adjacent chips provides for stability. An optional step is now described with reference to FIG. 3G.

Figure 3G:
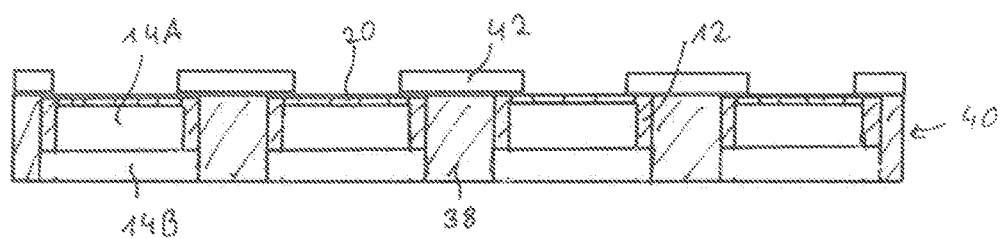

FIG. 3G shows reconstituted wafer 40 after an optional anisotropic etch step is performed which etches the material of the first wafer. In the present invention silicon is etched anisotropically. The anisotropic etch exposes MEMS structure 20 from the side of cavity 14 by etching away the silicon bottom of cavity 14 (see FIG. 3A). At the same time the side walls of cavities 14 are etched from a front face of the side walls, taking the side walls partially away. Cavity 14 is now divided into a first part 14A and a second part 14B. The cavity part 14A is delimited on one side by the MEMS structure 20 and by silicon side walls. At the side opposite of the MEMS structure 20 cavity part 14A is delimited by the second part 14B of the cavity. Cavity part 14B is delimited on one side by the cavity part 14A and by front faces of the silicon side walls. Cavity part 14B is further delimited by side walls made of encapsulation material 38. Cavity 14B is further delimited by a surface defined by the surfaces of encapsulation material 38 which constitutes an external surface of reconstituted wafer 40. As cavity 14B does not comprise silicon side walls, the width of second cavity part 14B is larger than a width of cavity part 14A. The two cavity parts 14A and 14B combined together form a back volume 14 for the MEMS microphone. Etching the silicon in the optional step may have the advantage that the back volume is increased. It may be further an advantage that remaining silicon side walls 12 provide a rigid construction for the overlying redistribution layer and for holding the MEMS structure. No masking is needed for the optional etch step.

Figure 3H:
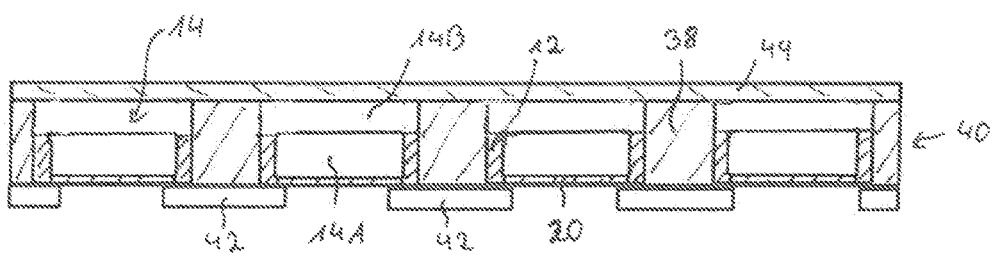

FIG. 3H shows reconstituted wafer 40 turned around about 180 degrees compared to FIG. 3G. Thus, the openings of cavities 14 are on the upper side. The openings of cavities 14 are covered or sealed with a lid 44. Lid 44 may be adapted to the form of reconstituted wafer 40 and seal at the same time all of the cavities 14. Lid 44 may be attached to encapsulation material 38 by an adhesive. Preferably lid 44 is attached to the encapsulant 38 by a permanent adhesive having a sufficiently high adhesive force and a sufficiently great temperature range for the intended use of the MEMS microphones. More generally, the permanent adhesive may be adapted to the MEMS packages formed. Prior to sealing the cavities any last uncovering or exposing step for the MEMS structures 20 is effectuated. As explained before the MEMS structures may be protected sacrificial layers. These layers may be etched away from both sides of the MEMS structure. Therefore, any exposing of the MEMS structure 20 must be effectuated before the lid 44 seals the cavities.

Figure 3I:
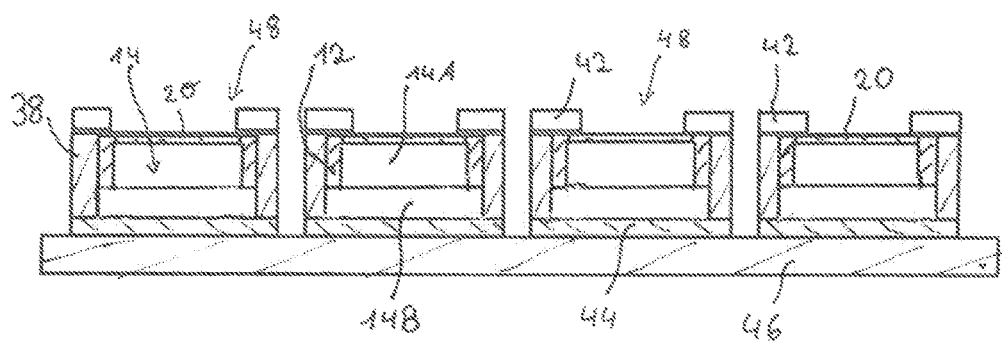

FIG. 3I schematically illustrates separation of the packaged MEMS chips 48 from each other. Reconstituted wafer 40, as shown in FIG. 3H, is turned around 180 degrees and arranged onto a temporary carrier 46 which may be a dicing tape. Lid 44 is facing the dicing tape 46. Separation or singulation of the packaged chips may be effectuated by any separation process as, for example, sawing. Reconstituted wafer 40 is cut passing the encapsulation material 38 situated between two chips. Separation may cut through the redistribution layer 42. Although the RDL 42 is only shown very schematically in the figures, it is to be understood that RDL 42 may provide electrical interconnects between electrically active components of the chips 22 and/or between the chips 22 and further chips placed in the same reconstituted wafer 40. As the cavities 14 are sealed with the lid 44, robust components are provided and any suitable separation method may be used. It is to be understood that although the method is explained with reference to packaging an MEMS chip the disclosure is not limited hereto and any chip comprising a cavity with an opening to a main surface of the chip may be packaged.

Figure 4:
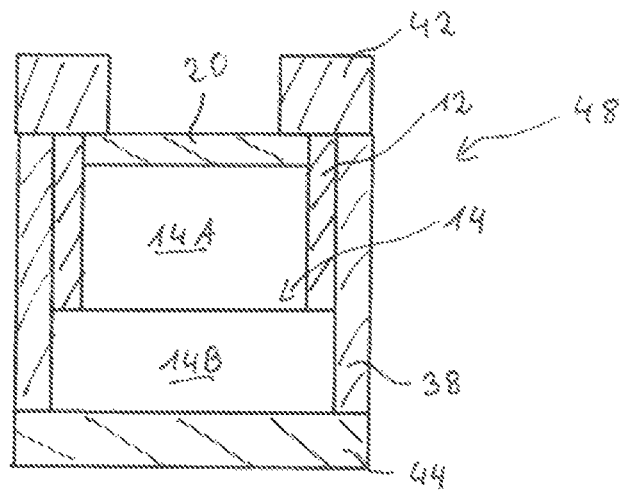
FIG. 4 schematically illustrates a cross-sectional view of a micro-electro-mechanical chip package in accordance with the disclosure.

FIG. 4 schematically shows a cross-sectional view of a chip package 48 according to the disclosure which may be an MEMS chip package 48. The embodiment shown in FIG. 4 comprises a cavity 14 separated into two cavity parts 14A and 14B. Package 48 is generally box-shaped with a lower surface formed by a lid 44 and with side walls formed from encapsulant material 38. A lower part 14B of the cavity is adjacent to lid 44 and bordered by encapsulant material 38. Package 48 further comprises side walls of the upper part of cavity 14A formed from silicon material of the first wafer or in other words from the chip. An outer surface of the side walls of cavity part 14A abuts encapsulant material 38. The upper part of cavity 14A is limited or bordered by a mechanically fragile structure e.g. an MEMS structure 20 which in the present embodiment may be a microphone membrane with a back plate. RDL 42 is arranged partly on the encapsulant 38 and partly on the silicon side walls 12 and parts of MEMS structure 20. RDL layer 42 forms an upper surface of the generally box-shaped chip package.

Figure 5:
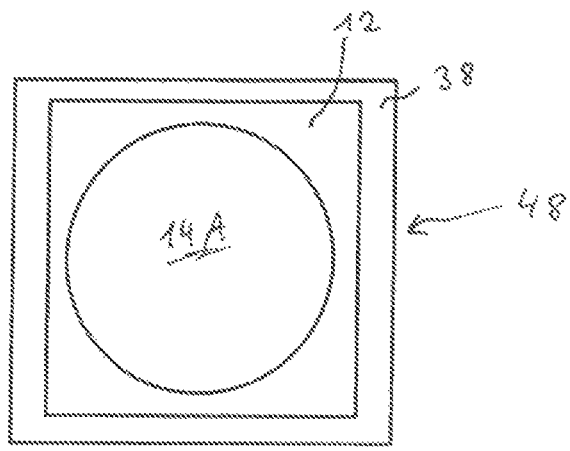
FIG. 5 schematically illustrates a top view of a micro-electro-mechanical chip package in accordance with the disclosure.

FIG. 5 shows schematically a top view of package 48 without MEMS structure 20 and without RDL 42. The outer circumference is formed by encapsulant material 38 packaging the chip from four sides. Silicon material 12 provides inner side walls for cavity part 14A. According to the embodiment shown, the cavity 14A is generally circular or cylindric.

Figure 6:
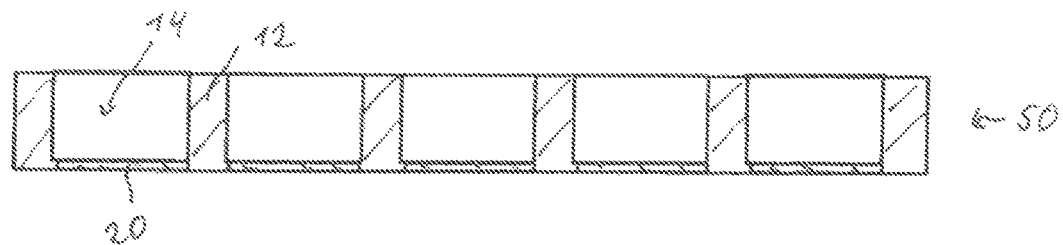
FIG. 6 schematically illustrates a cross-sectional view of a first wafer in accordance with a second embodiment.

FIG. 6 shows schematically in a cross-sectional view a provided first wafer 50 according to a second embodiment. Cavities are open to one main surface of first wafer 50. Cavities 14 extend through wafer 50 to mechanically fragile structures e.g. MEMS structures 20. Or in other words, the whole cavity or final cavity is etched already on the silicon wafer level. MEMS structure 20 may only be protected by sacrificial layers. As cavities 14 are protected during further processing by a cover or a filling material as discussed above, the protective silicon layer as shown on the bottom of cavity 14 in the embodiment discussed with reference to FIGS. 3A to 3I can be dispensed with. The further processing steps for packaging the chips provided with first wafer 50 are equal or similar to those discussed with reference to FIG. 3 and will not be explained further.

Figure 7:
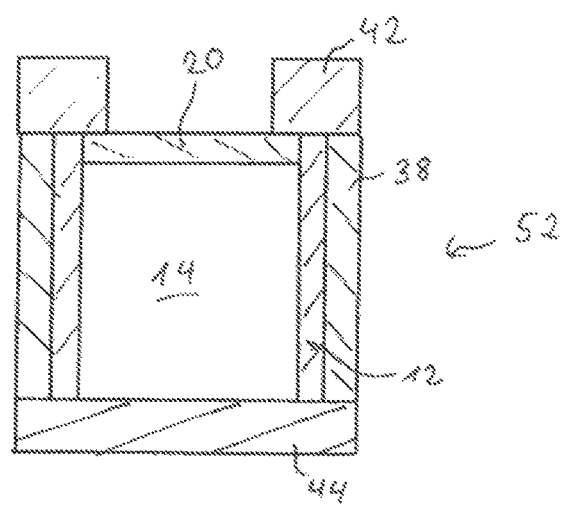
FIG. 7 schematically illustrates a cross-sectional view of a micro-electro-mechanical chip package in accordance with the second embodiment.

FIG. 7 shows a package 52 as obtained starting with wafer 50. Packaged chip 52 is generally block-shaped. A lower surface of package 52 is formed by lid 44. Side walls of package 52 are formed by encapsulant material 38. Encapsulant material 38 protects four sides of the chip. Cavity 14 is not separated into two parts. In other words, the side walls of cavity 14 are formed of the material of first wafer 50. In the present embodiment the side walls of cavity 14 are formed from silicon. The cavity 14 is closed on its upper side by MEMS structure 20. RDL layer 42 is arranged partly on encapsulant material 38, on silicon material 12 and on MEMS structure 20. Compared to the packaged chip 48, as shown in FIG. 4, the back volume 14 or cavity 14 is smaller. Cavity 14 is not enlarged in its lower part. In the fabrication process, the optional step of etching the silicon as explained with reference to FIG. 3G to further shape the cavity and to etch away the protective silicon layer adjacent to MEMS structure 20 is not necessary.

A third embodiment for producing a packaged chip, e.g a packaged MEMS chip is now explained with reference to FIGS. 8A-8F.

Figure 8A:
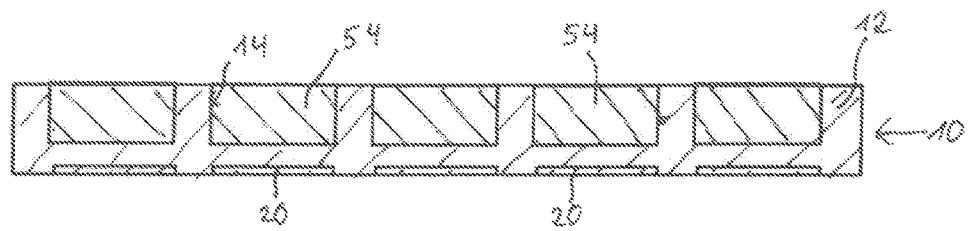
FIGS. 8A-8F schematically illustrate a method of producing a micro-electro-mechanical chip package in accordance with a third embodiment.

FIG. 8A shows a schematic cross view of first wafer 10 which may be the same wafer as shown in FIG. 1. First wafer 10 may be a silicon wafer comprising silicon material 12 and MEMS structures 20. Cavities 14 are etched into silicon wafer 12. A silicon layer remains between cavities 14 and MEMS structure 20. It is to be understood that first wafer 50, as shown in FIG. 6, could also be used in this third embodiment. FIG. 8A shows the cavities 14 filled with a filling material 54. The filling material 54 may be silicone based. The filling material 54 has preferably a characteristic which allows later an easy removal of the filling material. This characteristic may be a selective etchability with a high etching rate of the filling material compared to the etching rate of silicon and the used encapsulation material for a given etchant. The characteristic may be also water solubility. The distinguishing characteristic may also be a different coefficient of thermal expansion which allows for a given temperature a contracted filling material in comparison to the surrounding silicon. The filling material 54 may be printed, dispensed or spin-coated into the cavities 14. Other methods of applying the filling material 54 are also possible. The filling material is solidified.

Figure 8B:
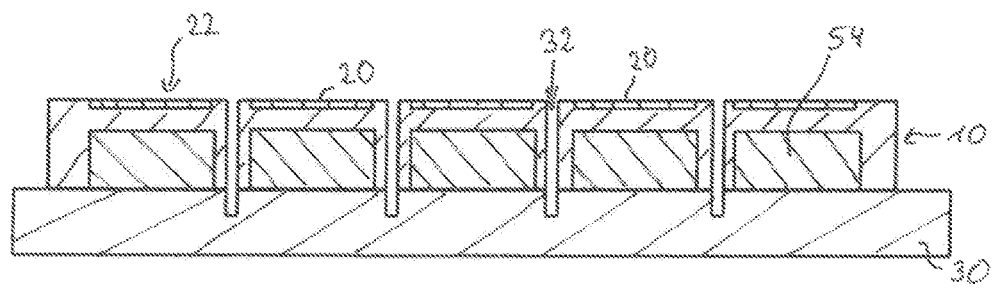

FIG. 8B shows schematically wafer 10 arranged on a temporary carrier 30. Temporary carrier 30 may be a dicing tape. Wafer 10 is arranged on the dicing tape 30 with the filled cavities facing the dicing tape. With other words, the MEMS structures 20 face away from the dicing tape. Cuts 32 separate the chips 22 from each other. Cuts 32 may follow the sawing lines 24 as shown in FIG. 2. Because of the filling material 54 no cover 26 is necessary to protect cavities 14. After singulation of chips 22 the chips may be picked-and-placed by a known pick-and-place tool.

Figure 8C:
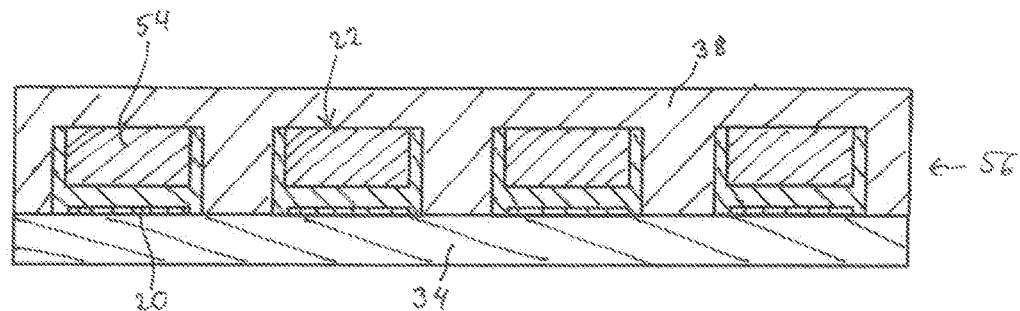

FIG. 8C shows the singulated chips 22 arranged on a further temporary carrier 34. Temporary carrier 34 may be the same as used in the embodiment explained with reference to FIG. 3D. Although not shown in FIG. 8C, adhesive layer 36 may be arranged between the temporary carrier 34 and the chips 22. The chips 22 are placed on the temporary carrier with the MEMS structures 20 facing the carrier. An encapsulant material 38 encapsulates the chips 22 forming a reconstituted wafer 56. The encapsulant material 38 covers the chips and the filling material 54.

Figure 8D:
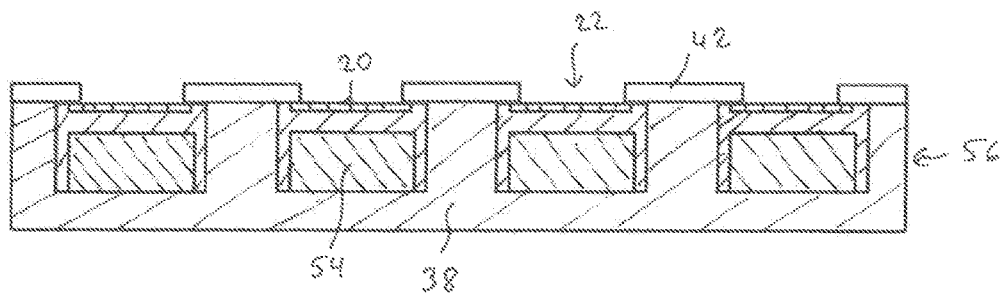

FIG. 8D shows schematically in a cross view the reconstituted wafer 56 turned around about 180 degrees with reference to FIG. 8C. Temporary carrier 34 is removed. As already discussed with reference to FIG. 3I, an RDL 42 is arranged on the reconstituted wafer 56. It is to be understood that, although not shown, the RDL may comprise through-connections and provides interconnection between different electrical circuit parts.

Figure 8E:
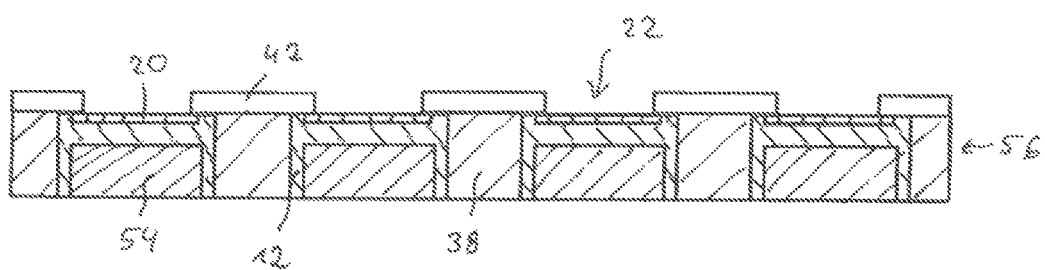

FIG. 8E shows the reconstituted wafer 56 after a grinding process has been performed. Part of the encapsulation material 38 has been removed by grinding. Grinding may also remove part of silicon 12 and filling material 54. The cavities are re-exposed but still filled with the filling material 54. Depending on the filling material used the filling material is now removed.

Figure 8F:
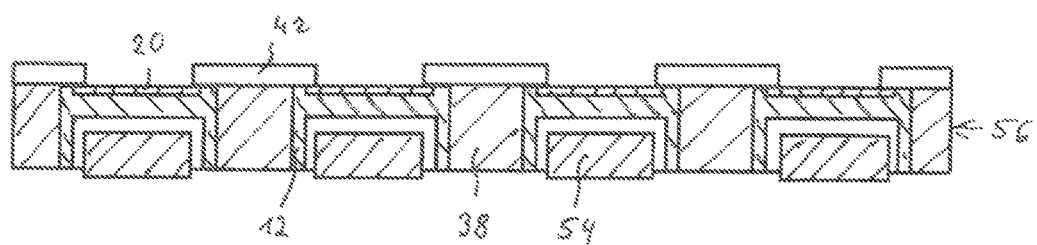

FIG. 8F illustrates schematically the removal of filling material 54 in case where the filling material has a different coefficient of temperature expansion (CTE) than silicon. Depending on the coefficient differences, reconstituted wafer 56 is cooled down or heated so that the filling material 54 contracts and can be easily taken off the cavities 14. In other embodiments, the reconstituted wafer may undergo an etching process etching only the filling material. In other embodiments, the reconstituted wafer may undergo a water cleaning step if the filling material 54 is water soluble. Processing of the reconstituted wafer 56 may now be continued as explained with reference to FIGS. 3G-3I.

While the invention has been illustrated and described with respect to one or more implementations, alterations and/or modifications may be made to the illustrated examples without departing from the spirit and scope of the appended claims. In particular regard to the various functions performed by the above described components or structures (devices, circuits, systems, etc.), the terms used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method of producing a chip package, the method comprising:
   providing a plurality of chips on a first wafer, each chip comprising a first main face and a cavity having an opening to the first main face;
   temporarily filling or covering the cavities;
   singulating the chips after temporarily filling or covering the cavities;
   embedding the singulated chips in an encapsulation material; and
   re-exposing the cavities after embedding the singulated chips in the encapsulation material,
   wherein the cavities are re-exposed by a grinding process,
   wherein the encapsulation material encapsulates a cover which temporarily covers the cavities,
   wherein the encapsulation material and the cover are ground during the singulating of the chips.

2. The method of claim 1, wherein each chip has a second main face opposite the first main face and each of the cavities is delimitated by a mechanically fragile structure at the second main face.

3. The method of claim 2, wherein the mechanically fragile structure is one of a micro-electro-mechanical structure, a micro-optical-mechanical structure, a thin integrated circuit, and a vertical semiconductor component.

4. The method of claim 1, wherein the cover comprises a second wafer or a rigid foil.

5. The method of claim 1, wherein the cover is adhesively bonded to the first wafer.

6. The method of claim 1, wherein the cavities are temporarily covered under vacuum.

7. The method of claim 1, wherein the cavities are temporarily covered under a specific atmospheric pressure adapted to pressures to which the chips are submitted during further processing.

8. The method of claim 1, wherein the cavities are filled with a liquid prior to being temporarily covered.

9. The method of claim 1, wherein the cavities are temporarily filled with a filling material, the filling material being selectively removable from the cavities.

10. The method of claim 9, wherein the filling material is one of water soluble and selectively etchable.

11. The method of claim 9, wherein the filling material has a coefficient of thermal expansion which is different from the coefficient of thermal expansion of the first wafer.

12. The method of claim 1, further comprising etching the first wafer after re-exposing the cavities.

13. The method of claim 12, wherein a bottom of the cavities and an upper surface of the first wafer surrounding the cavities is etched.

14. A method of producing a chip package, the method comprising:
   providing a plurality of chips on a first wafer, each chip comprising a first main face and a cavity having an opening to the first main face;
   temporarily covering the cavities;
   filling the cavities with a liquid prior to temporarily covering the cavities;
   singulating the chips after temporarily covering the cavities;
   embedding the singulated chips in an encapsulation material; and
   re-exposing the cavities after embedding the singulated chips in the encapsulation material.

15. The method of claim 14, further comprising etching the first wafer after re-exposing the cavities.

16. The method of claim 14, wherein the cavities are re-exposed by a grinding process, wherein the encapsulation material encapsulates a cover which temporarily covers the cavities, and wherein the encapsulation material and the cover are ground during the singulating of the chips.

17. A method of producing a chip package, the method comprising:
   providing a plurality of chips on a first wafer, each chip comprising a first main face and a cavity having an opening to the first main face;
   temporarily filling or covering the cavities;
   singulating the chips after temporarily filling or covering the cavities;
   embedding the singulated chips in an encapsulation material;
   re-exposing the cavities after embedding the singulated chips in the encapsulation material; and
   etching the first wafer after re-exposing the cavities.

18. The method of claim 17, wherein a bottom of the cavities and an upper surface of the first wafer surrounding the cavities is etched.

19. The method of claim 17, further comprising filling the cavities with a liquid prior to being temporarily covered.

20. The method of claim 17, wherein the cavities are re-exposed by a grinding process, wherein the encapsulation material encapsulates a cover which temporarily covers the cavities, and wherein the encapsulation material and the cover are ground during the singulating of the chips.

* * * * *